United States Patent

Coleman, Jr. et al.

[15] 3,673,514

[45] June 27, 1972

[54] SCHOTTKY BARRIER TRANSIT TIME NEGATIVE RESISTANCE DIODE CIRCUITS

[72] Inventors: Donald James Coleman, Jr., Warren; Simon Min Sze, Berkeley Heights, both of N.J.

[73] Assignee: Bell Telephone Laboratories, Incorporated, Murray Hill, Berkeley Heights, N.J.

[22] Filed: Dec. 31, 1970

[21] Appl. No.: 103,253

[52] U.S. Cl. ..........................331/107 R, 307/318, 307/324, 317/234 V, 317/235 UA, 317/235 AM, 330/5, 330/34, 330/61 A, 331/96

[51] Int. Cl. ........................H01l 3/00, H03b 7/14, H03f 3/10

[58] Field of Search .......331/107 R, 96; 317/234 V, 235 UA, 317/235 AM; 307/318, 324, 325; 330/5, 34, 61 A

[56] References Cited

UNITED STATES PATENTS

| | | | |
|---|---|---|---|
| 3,439,290 | 4/1969 | Shinoda | 331/107 G |
| 3,537,021 | 10/1970 | Thim | 330/5 |

*Primary Examiner*—Roy Lake
*Assistant Examiner*—Siegfried H. Grimm
*Attorney*—R. J. Guenther and Arthur J. Torsiglieri

[57] ABSTRACT

In a preferred form, a negative resistance diode comprises a semiconductor wafer contained between two Schottky barrier contacts. The diode is biased below avalanche breakdown, but above a critical "reach-through" voltage, which, with appropriate diode parameters and an appropriate external circuit, causes minority carriers to be injected by the forward-biased contact to give a transit time negative resistance. When used as an oscillator, the device gives a significantly lower noise figure than analogous Impatt diodes. Amplifier and voltage limiter embodiments are also described.

7 Claims, 18 Drawing Figures

INVENTORS D. J. COLEMAN, JR.
S. M. SZE

BY Roderick B. Anderson

ATTORNEY

SCHOTTKY BARRIER TRANSIT TIME NEGATIVE RESISTANCE DIODE CIRCUITS

BACKGROUND OF THE INVENTION

This invention relates to negative resistance diode circuits, and more particularly, to such circuits used as oscillators, amplifiers, and voltage limiters.

The U.S. Pat. of Read, No. 2,899,652, describes how a multilayer avalanche diode can be made to present a negative resistance and, when placed in a proper resonant circuit, generate microwave oscillations. An applied direct-current voltage, in conjunction with the resonant circuit, periodically biases a pn junction to avalanche breakdown, thereby creating current pulses each of which travels across a transit region within a prescribed time period. This transit time is arranged with respect to the resonant frequency of the external resonator such that r-f voltages in the diode terminals are out of phase with the current pulses in the diode. The current through the circuit increases as the voltage across the terminals decreases, thus establishing a negative resistance, and converting part of the d-c energy applied to the diode to r-f energy in the resonator.

Improved microwave oscillator avalanche diodes, or Impatt diodes, are described, for example, in the U.S. Pat. of B. C. De Loach, Jr., et al., 3,270,293 (assigned to Bell Telephone Laboratories, Incorporated), and the paper "The Impatt Diode -- A Solid State Microwave Generator," Bell Laboratories Record, by K. D. Smith, Vol. 45, May 1967, page 144. Whereas the Read diode is a four-layer device, the new Impatt diode forms are typically $p^+\nu n^+$ or $n^+\pi p^+$ structures with only three layers, but they operate on the same principle. The copending application of De Loach et al., Ser. No. 883,898, filed Dec. 10, 1969, describes another form of Impatt diode comprising a semiconductor wafer contained between opposite Schottky barrier contacts. One of the Schottky barrier junctions is periodically reverse-biased to avalanche breakdown, thus creating current pulses that travel across a transit region defined by the semiconductor wafer.

As compared to other solid state microwave sources, the Impatt diode is rather noisy. Generated noise can be reduced by increasing the Q of the microwave resonator, but this in turn undesirably reduces efficiency. Despite this inherent compromise, the Impatt diode is presently considered to have overall superiority over competitive devices such as the tunnel diode, Gunn-effect diode, and the microwave transistor.

SUMMARY OF THE INVENTION

In the course of conducting exploratory experiments on Schottky barrier Impatt diodes of the type described in the aforementioned De Loach et al. application, we detected certain anomalous characteristics that apparently contradicted generally understood theory. We therefore extensively analyzed the device and found that under certain conditions it was capable of substantial current conduction through minority carrier injection. This was somewhat surprising since the conduction of minority carriers is usually so small in Schottky barrier diodes that it can be safely ignored. We have found, however, that with an appropriate circuit and appropriate device parameters, minority carrier conduction is not only substantial, but it is the basis of a new negative resistance mechanism in accordance with the present invention.

An oscillator embodiment of the invention operates much as an Impatt diode oscillator except that the current pulse in the device is produced by minority carrier injection at a forward-biased Schottky barrier junction, rather than by avalanche multiplication. With appropriate parameters, copious minority carrier injection will commence at a critical "reach-through" voltage below the avalanche breakdown voltage to produce a current pulse having a transit time through the diode wafer appropriate for giving negative resistance. As will be seen later, such a diode may also be used as a voltage limiter; that is, when the applied voltage exceeds the threshold, copious conduction takes place to limit the voltage that is transmitted.

To give negative resistance by forward-biased minority carrier injection in accordance with the invention, the following requirements must be met:

1. The forward-biased diode contact must form a Schottky barrier junction, although the reverse-biased junction need not necessarily be a Schottky barrier.

2. The active region of the wafer must be thin enough to give voltage reach-through prior to avalanche breakdown. That is, the voltage gradient resulting from the applied bias must extend the entire distance between the forward-biased and the reverse-biased junctions, but this voltage must never exceed the avalanche threshold.

3. The flat-band voltage of the wafer at the Schottky barrier forward-biased junction must be lower than the breakdown voltage. As will be explained later, the flat-band voltage is the voltage at which the energy levels representative of the lower edge of the conduction band and the upper edge of the valence band are uniform or "flat" for a substantial distance from the forward-biased junction into the wafer; this results from a zero electric field condition at the junction.

4. The minority carrier barrier at the Schottky barrier junction must be sufficiently low to give high current forward injection at the flat-band voltage. This condition is met if the minority carrier barrier is smaller than half the energy gap between the conduction and valence bands.

5. If the device is to be used as a transit time negative resistance device, the active wafer length should be adjusted to give a transit time of current between the junctions equal to approximately three-fourths of one period of oscillation at the resonant frequency.

With the foregoing conditions met, negative resistance from the diode can be obtained at bias values below the avalanche breakdown voltage. Since current results from forward-biased minority carrier injection rather than avalanche multiplication, the noise figure achieved is much lower than that of comparable Impatt diode circuits. When used as a voltage limiter, the device offers advantages of lower voltage limitation and easier design of the voltage limiter device.

These and other objects, features, and advantages of the invention will be better understood from a consideration of the following detailed description taken in conjunction with the accompanying drawing.

DRAWING DESCRIPTION

Figure 3A:
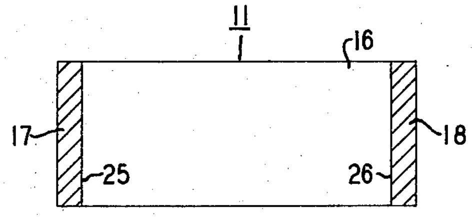
FIG. 3A is a schematic illustration of the diode of FIG. 1.
Figure 9:
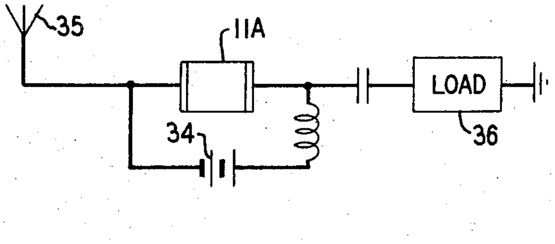
Figure 10:
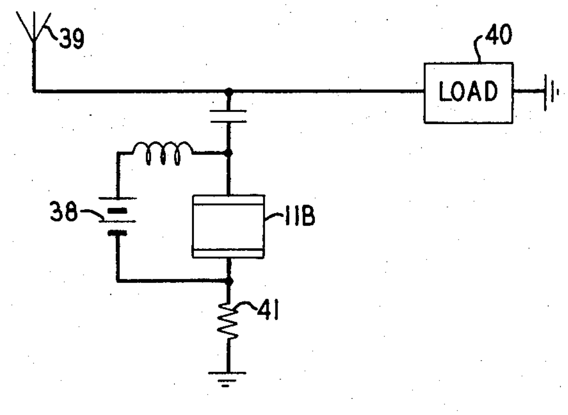
Figure 7:
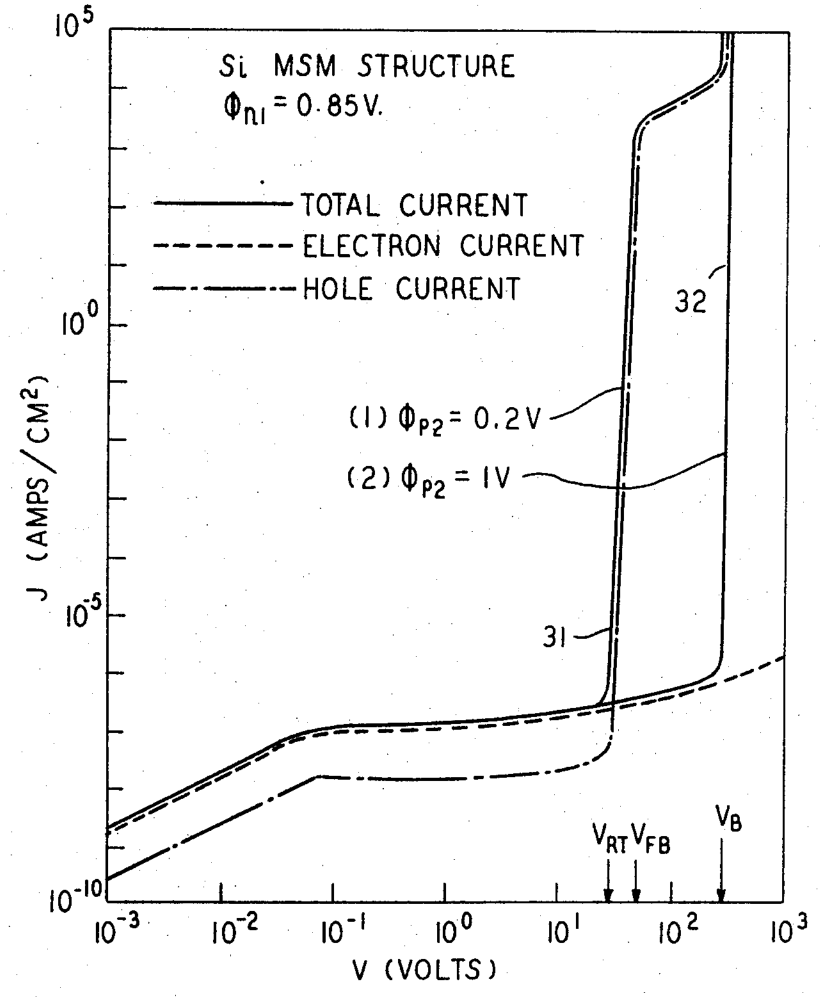
Figure 8:
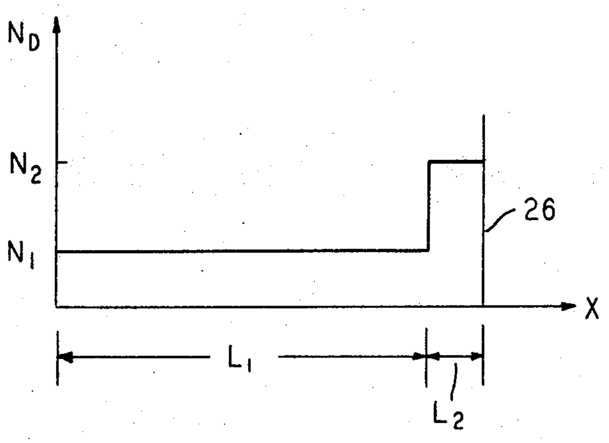
Figure 11A:
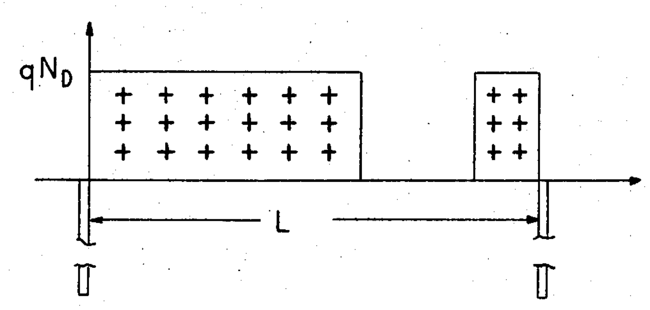
Figure 11B:
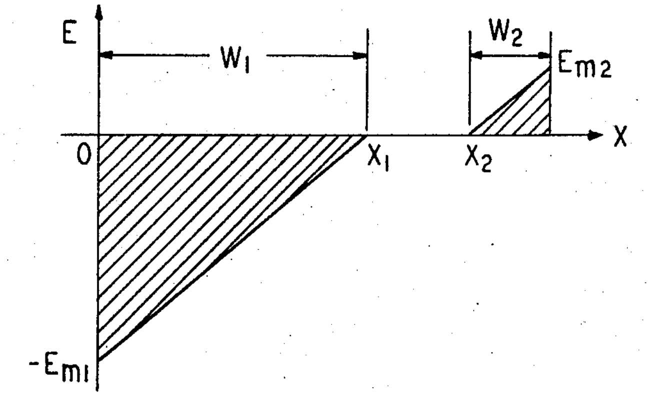
Figure 11C:
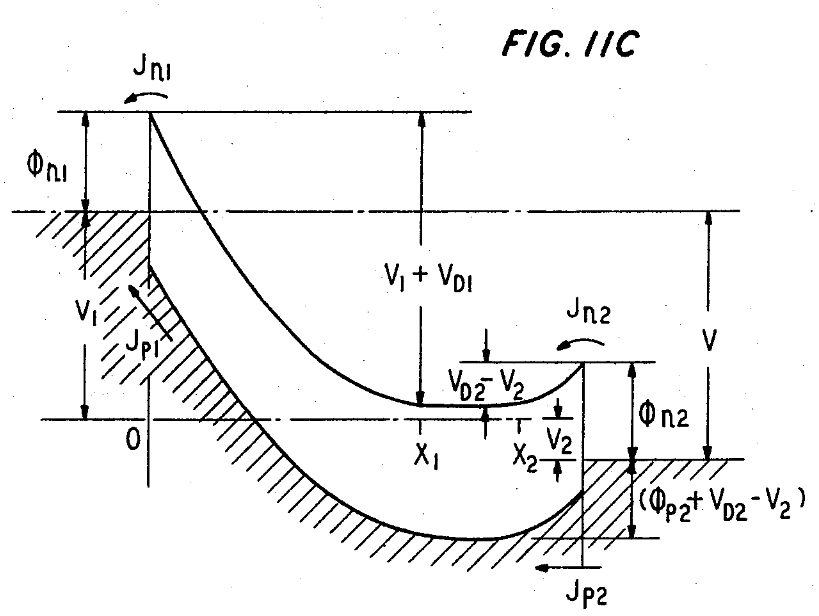

FIGS. 3B, 4A, 4B, 5A, 5B, 6A, and 6B are graphs of voltage versus distance and energy versus distance of the diode of FIG. 3A under different conditions of operation;

FIG. 7 is a graph of current density versus voltage in a diode of the type shown in FIG. 3A;

FIG. 8 is a graph of carrier concentration versus distance that may be used in a diode of the type shown in FIG. 3A;

FIG. 9 is a schematic illustration of another embodiment of the invention;

FIG. 10 is a schematic illustration of still another embodiment of the invention; and FIGS. 11A, 11B, and 11C are respectively graphs of charge distribution, electric field, and energy versus distance in the diode of FIG. 3A.

DETAILED DESCRIPTION

Figure 1:
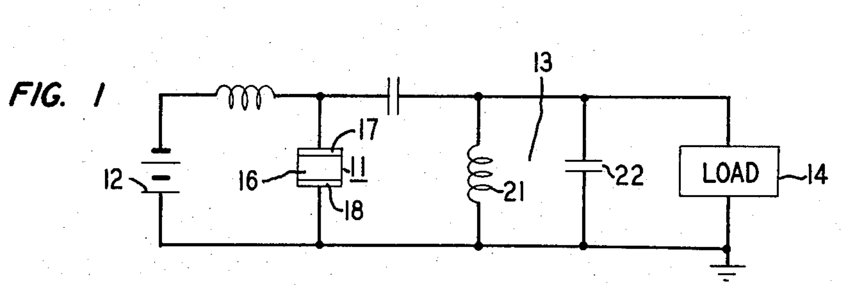
FIG. 1 is a schematic view of an illustrative embodiment of the invention.

Referring now to FIG. 1, there is shown an oscillator circuit in accordance with an illustrative embodiment of the invention comprising a diode 11 biased by a d-c source 12 and contained within a circuit comprising a resonator 13 and a load 14. The diode 11 comprises a semiconductor wafer 16 contained between opposite Schottky barrier contacts 17 and 18.

The resonator 13 is shown schematically as comprising a capacitance 22 and an inductance 21, although in practice it would be a microwave cavity resonator.

Figure 2A:
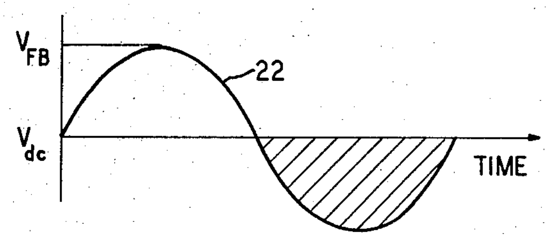
FIG. 2A is a graph of voltage across the diode of FIG. 1 versus time.
Figure 2B:
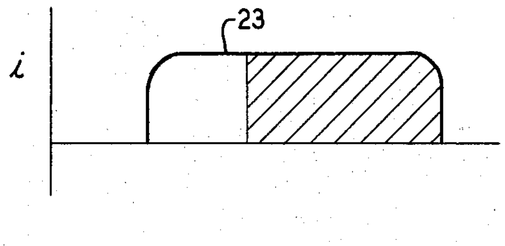
FIG. 2B is a graph of current in the diode of FIG. 1 versus time.

The diode 11 develops a negative resistance, enabling it to convert d-c energy from source 12 to r-f energy, by principles similar to those which apply to the Impatt diode. That is, diode 11 causes current to flow in the circuit during negative portions of the r-f voltage cycle of the resonator. This phenomenon is illustrated graphically in FIGS. 2A and 2B in which curve 22 represents applied voltage across the diode and curve 23 represents terminal current with respect to time.

In accordance with the invention, substantially no current flows through the diode until the voltage approaches a threshold value $V_{FB}$, which triggers a pulse of current in the diode. The length of the diode is tailored with respect to carrier velocity such that the transit angle is approximately $(3\pi/2)$; that is, the time taken for the current pulse to traverse the diode wafer is approximately equal to three-fourths of a period of the r-f frequency component. As a result, current flows through the circuit during the negative portion of the voltage cycle in opposition to the voltage, thereby establishing a negative resistance. Thus, the shaded portions of curves 22 and 23 indicate negative resistance, while the remaining portion of the curves, in which currents and voltages are in phase, represents positive resistance; it can be seen that with an appropriate transit angle, a substantial net negative resistance is attainable.

Whereas the Impatt diode depends on avalanche multiplication for forming the required transit-time current pulses, the present invention makes use of a newly discovered minority carrier injection phenomenon. In explaining this mechanism, reference will be made to FIGS. 3 through 6. FIG. 3A is a schematic diagram of the diode 11 of FIG. 1 which establishes a reference distance for the graphs of FIGS. 3B through 6B. Contact 17 forms with wafer 16 a Schottky barrier junction 25, while contact 18 forms with the wafer a Schottky barrier junction 26.

Figure 3B:
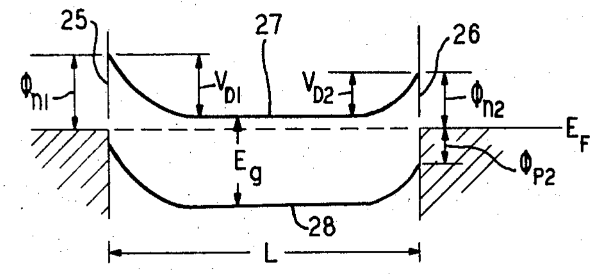

The energy band diagram for the diode 11 at thermal equilibrium is shown in FIG. 3B, where curve 27 is the lower boundary of the conduction band, curve 28 is the upper boundary of the valence band and $E_F$ is the Fermi level. The wafer is taken to be of n-type material and $\phi_{n1}$ and $\phi_{n2}$ are the majority carrier barrier heights at junctions 25 and 26, respectively. $V_{D1}$ and $V_{D2}$ are the built-in potentials resulting from the barriers, and L is the thickness of the wafer. The barrier of junction 26 to minority carriers, or holes, is shown by $\phi_{p2}$.

Figure 4A:
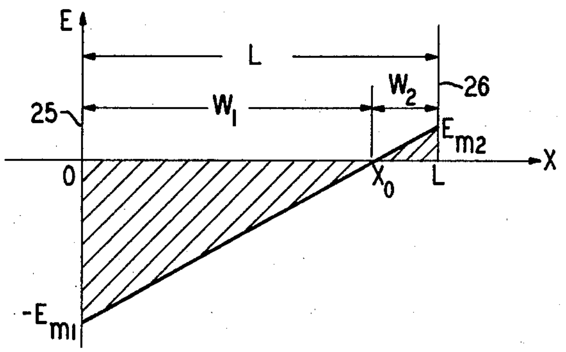
Figure 4B:
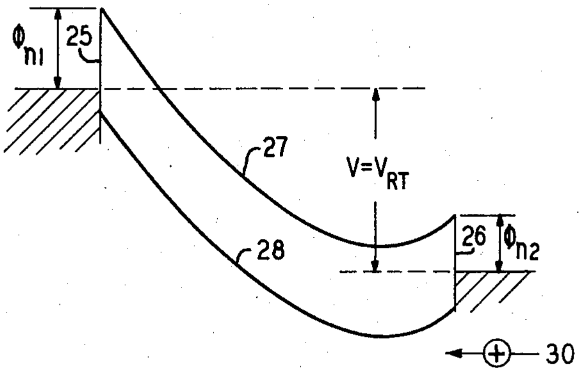

With the applied voltage shown in FIG. 1, contact 17 is biased negatively, which reverse-biases Schottky barrier junction 25, while contact 18 is biased positively, which forward-biases junction 26. As the applied voltage increases, the sum of the two depletion region widths also increases. Eventually, at a reach-through voltage $V_{RT}$, the two depletion regions touch each other and the sum exactly equals L; this is illustrated in FIG. 4A which shows electric field E as a function of distance $x$. FIG. 4B shows the corresponding change in energy level of the band boundaries 27 and 28 as a result of the applied voltage of FIG. 4A.

Figure 5A:
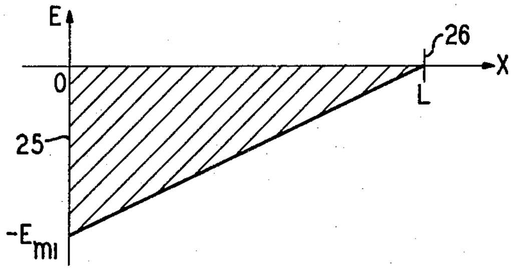
Figure 5B:
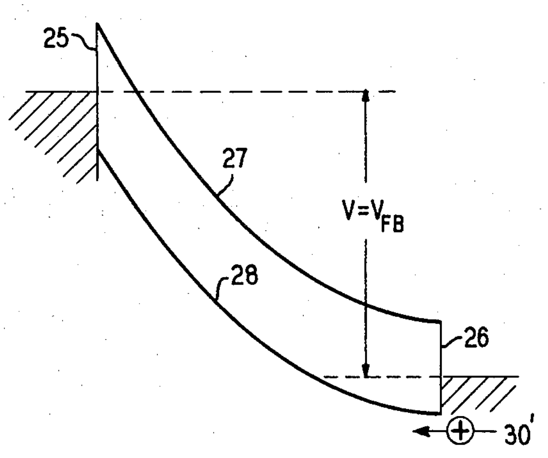
Figure 6A:
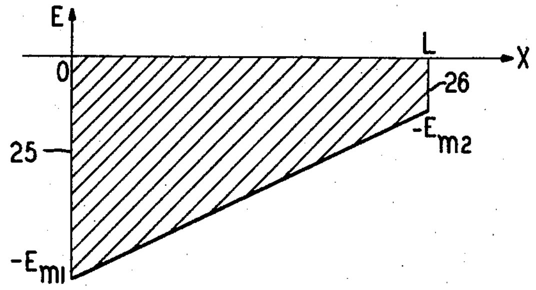
Figure 6B:
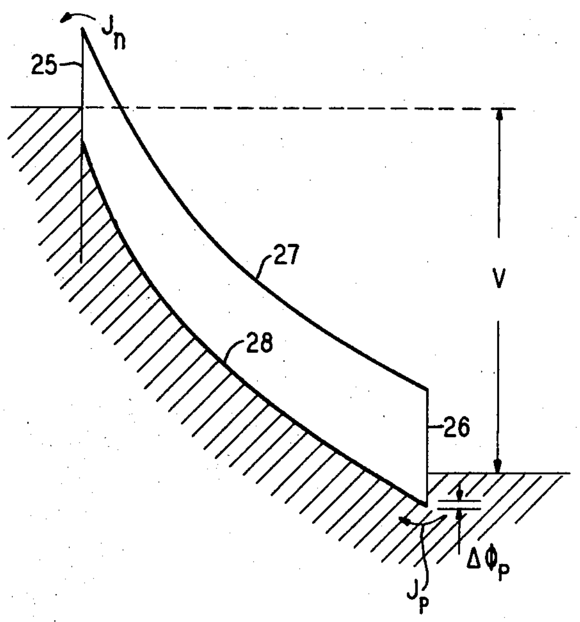

As the voltage increases further, the electric field at distance L, i.e., at junction 26, eventually becomes zero; this condition is shown in FIG. 5A. At this critical voltage, the band boundaries 27 and 28 extend horizontally from junction 26 as shown in FIG. 5B, or in other words are "flat." This defines the "flat-band" voltage $V_{FB}$ shown in FIG. 5B. A further voltage increase results in the electric field distribution shown in FIG. 6A and further energy band bending as illustrated in FIG. 6B. The maximum voltage that can be applied is, of course, limited by the avalanche breakdown condition at the reverse-biased junction 25.

With the foregoing in mind, the onset of current at a voltage approaching $V_{FB}$, depicted in FIG. 2, can be appreciated from the following considerations. Referring to FIG. 4B, when voltage $V_{RT}$ is reached, an electric field extends the entire distance across the wafer and it is possible for a minority carrier 30 to be injected across junction 26 and to be conducted across the wafer. Ordinarily, minority carrier flow in a Schottky barrier diode can be disregarded as being small in comparison to majority carrier current. In FIG. 4A, however, the majority carrier Schottky barrier junction 25 having the energy level $\phi_{n1}$ prevents majority carrier injection and, since the wafer is fully depleted, minority carrier current flow may be relatively significant. As the voltage increases further, the barrier to minority carrier injection is effectively reduced until, at the flat-band condition shown in FIG. 5B, the barrier to minority carrier injection is minimized, thereby permitting copious minority carrier injection as illustrated by carrier 30'.

The resulting current increase is depicted in FIG. 7 in which curve 31 shows that the current increases only slowly with voltage until the reach-through voltage $V_{RT}$ is reached, at which time the current density increases dramatically to a maximum at the flat-band voltage $V_{FB}$. Thereafter, the current again increases only modestly until it reaches the avalanche breakdown voltage $V_B$. At avalanche breakdown, of course, the high current density results from majority carrier generation through avalanche multiplication.

It is clear that our mechanism requires that the reach-through voltage $V_{RT}$ and flat-band voltage $V_{FB}$ both be lower than the breakdown voltage $V_B$. It can also be intuitively appreciated that the current at the flat-band voltage is a function of the minority carrier barrier $\phi_{p2}$ shown in FIG. 3B; that is, as the height of the barrier $\phi_{p2}$ decreases, the current at the flat-band voltage increases. This has been shown experimentally and is illustrated on the graph of FIG. 7, in which curve 32 shows that, with a much higher minority carrier barrier than that of curve 31, there is no observable flat-band voltage and no significant current increase until the breakdown voltage $V_B$ is reached. These considerations lead to the requirement that the minority carrier barrier must be smaller than half the energy gap $E_g$ between the conduction and valence bands, or $$\phi_{p2} < (E_g/2) \qquad (1)$$

The construction of Schottky barrier contacts to give a desired barrier involves considerations well known in the art. With a silicon wafer, platinum-silicide contacts can be applied to give a suitably low minority carrier barrier. Cesium or magnesium may be suitable for p-type silicon, platinum is recommended for n-type gallium arsenide, and gold would appear to be suitable for n-type germanium.

In summary, the diode of FIG. 1 must meet the following requirements:

1. the forward-biased diode contact must form a Schottky barrier junction;
2. the active region of the wafer must be thin enough to give voltage reach-through prior to avalanche breakdown;
3. the flat-band voltage of the wafer at the Schottky barrier forward-biased junction must be lower than the breakdown voltage;
4. the minority carrier barrier must be smaller than half the band-gap energy;
5. for optimum efficiency, the transit time of current across the wafer should be equal to approximately three-fourths of one period of oscillation at the resonant frequency.

Notice that it is not necessary that reverse-biased junction 25 be a Schottky barrier junction. It must be a rectifying junction, however, with a suitable barrier to prevent majority carrier injection which would otherwise overwhelm the minority carrier conduction. If a pn junction is used, the active region is only that portion of the wafer between the pn junction and the forward-biased Schottky barrier.

While the foregoing has assumed a constant doping level of the n-type wafer, diode efficiency may be increased by using a nonuniform doping as illustrated by the graph of FIG. 8 which shows majority carrier concentration $N_D$ as a function of distance. The purpose of this doping profile is to insure a high electric field through a major portion of the transit region during the entire cycle of operation of the device.

With uniform doping, the electric field is designed to approach zero at the forward-biased junction as explained before. This means that injected carriers will travel a significant distance in a low-field low-velocity region, where their velocity is a function of the oscillating field. The resultant velocity variations can give a harmful dispersion. However, with the nonuniform doping profile shown in FIG. 8, most of the voltage change occurs across the highly doped region immediately adjacent the forward-biased junction 26. Since there will be little fluctuation in the remaining portion of the wafer, the current pulse experiences a high field during nearly its entire transit, thus increasing efficiency.

With an n-type silicon wafer 10 microns long, it is feasible that $L_1$ be 9 microns and $L_2$ be 1 micron. The lower carrier concentration $N_1$ may be $10^{14}$ $cm^{-3}$, while the higher majority carrier concentration $N_2$ in region $L_2$ may be $10^{16}$ $cm^{-3}$. Whatever doping levels are used, the wafer must meet the five requirements listed above, and so optimizing the efficiency constitutes a design problem which depends in large extent on the semiconductor material used.

FIG. 9 shows the use of the diode 11A, which meets the criteria of diode 11 of FIG. 1, as an amplifier. The diode is biased near its flat-band voltage by a battery 34. Signal energy originating at an antenna 35 is transmitted through the diode to a load 36. As can be seen from reference to FIG. 2A, whenever the a-c signal approaches the flat-band voltage $V_{FB}$, a current pulse is induced in the diode, effectively amplifying the applied current. Thus, the amplifying circuit may be used as a pulse regenerator, or as an amplifier of frequency modulated or phase modulated waves.

FIG. 10 shows the use of a diode 11B, again of the type shown in FIG. 3A, as a limiter. A battery 38 biases the diode 11B at a voltage which is lower than the flat-band voltage by a value equal to the limited voltage value. A signal to be limited is transmitted from an antenna 39 to a load 40. If it is desired to limit the voltage transmitted to, for example, 3 volts, the diode 11B is biased at a d-c voltage which is 3 volts below the flat-band voltage.

As long as the transmitted signal voltage does not exceed 3 volts, the diode is nonconducting, and the signal is transmitted unimpeded to the load 40. However, if the signal voltage is sufficient to raise the diode bias to the flat-band voltage $V_{FB}$, the diode then conducts and constitutes a low impedance path to a dissipative impedance 41.

One advantage of a limiter made in accordance with the present invention is that the limiting voltage can be made smaller than that of analogous voltage limiters that operate on the basis of avalanche breakdown. Another advantage is that the flat-band voltage can be easily adjusted to give voltage limiting at any of numerous levels as may be desired in the course of a circuit design. It can be shown, that, for a uniformly doped semiconductor, the flat-band voltage is related to doping and wafer thickness by the expression $$V_{FB} = (q\, N_D L^2 / 2\, \epsilon_s) \qquad (2)$$

where $N_D$ is the majority carrier concentration, $L$ is wafer thickness, and $\epsilon_s$ is the wafer dielectric permittivity.

With a silicon wafer, platinum-silicide Schottky barrier contacts, a wafer thickness of 7 microns, and $N_D$ being $5 \times 10^{13}$ $cm^{-3}$, the limiting voltage is about 2 volts, which is substantially smaller than that available from other limiters. For example, silicon limiters using avalanche breakdown, may not be used for voltage limits below about 8 volts, while silicon tunnel diode limiters are limited to about 5 volts. Furthermore, with either avalanche or tunnel diode limiters, the limiting voltage is determined solely by the doping level, while with our device, the parameters $N_D$ and $L$ can be varied independently to give a larger degree of freedom as is often required in integrated circuit design. It should be understood that the limiter is not a transit time negative resistance device, and thus, it need not meet requirement (5), stated above, that the transit time be related to a resonant frequency. The other four requirements generally relate to successful minority carrier injection, which is also required in our limiter diode.

A detailed explanation of the physical mechanisms underlying our invention, along with experimental data, are given in the Appendix.

The foregoing embodiments have been presented as only being illustrative of our inventive concepts. For example, it is clear that conductivities complementary to those explicitly described could alternately be used. Various other embodiments and modifications may be made by those skilled in the art without departing from the spirit and scope of the invention.

APPENDIX

I. POTENTIAL DISTRIBUTION AND ELECTRON CURRENT IN METAL-SEMICONDUCTOR-METAL (MSM) STRUCTURES

When a negative voltage is applied to the metal-semiconductor contact 17 with respect to contact 18, as shown in FIG. 1, the barrier 25 is reverse-biased and barrier 26 is forward-biased. The electron current is due to the thermionic emission of electrons from contact 17. The current continuity requirement dictates that the electron currents across both barriers must be equal.

1. Small Voltage Range

For biases sufficiently low that the sum of the depletion widths $W_1$ and $W_2$ is smaller than the thickness L, the charge distribution of an MSM structure is shown in FIG. 11A for an n-type semiconductor with ionized impurity concentration $N_D$. The corresponding electric field and the potential distribution as obtained from the integrations of the Poisson equation are shown in FIGS. 11B and 11C, respectively.

The applied voltage V is shared between these two contacts, so that $$V = V_1 + V_2. \qquad (3)$$

From current continuity requirements (refer to FIG. 11C) we have (assuming same areas for both contacts)

$$J_{n1} = J_{n2} \qquad (4)$$

The reverse current density $J_{n1}$ in the contact 17 is given by $$J_{n1} A_n{}^* T^2 e^{-\beta\phi_{n1}} e^{\beta(\Delta\phi_{n_1} + \alpha_1 E_{m1})} (1 - e^{-\beta V_1}) \qquad (5)$$

where $A_n{}^=$ is the effective Richardson constant for electrons, $T$ the temperature, $\beta = q/kT$, $E_{m1}$ is the maximum electric field (at $x = 0$), $\alpha_1$ is the intrinsic barrier lowering coefficient, and $\Delta\phi_{n1}$ is the Schottky barrier lowering given by $$\Delta\phi_{n1} = \sqrt{(qE_{m1}/4\pi\epsilon_s)} \qquad (6)$$

with $$E_{m1} = \sqrt{\frac{2qN_D}{\epsilon_s}(V_1 + V_{D1}} \qquad (7)$$

The forward current density $J_{n2}$ is given by $$J_{n2} = A_n{}^* T^2 e^{-\beta\phi_{n2}} e^{\beta(\Delta\phi_{n2} + \alpha_2 E_{m2})} (e^{\beta V_2} - 1) \qquad (8)$$

where $\Delta\phi_{n2}$ can be obtained in equation (6) with $(V_{D2} - V_2)$ replacing $(V_1 + V_{D1})$.

Substitution of equations (5) and (8) into (4) yields the relationship between $V_1$ and $V_2$ $$(\Delta\phi_{n1} - \Delta\phi_{n2}) + (\alpha_1 E_{m1} - \alpha_2 E_{m2}) - (\phi_{n1} - \phi_{n2}) = \frac{1}{\beta} \ln \left[ \frac{(e^{\beta V_2} - 1)}{(1 - e^{-\beta V_1}} \right] \qquad (9)$$

For a symmetrical metal-semiconductor-metal (MSM) structure with $\phi_{n1} = \phi_{n2}$, $V_{D1} = V_{D2} = V_D$, and assuming $\alpha_1 = \alpha_2 = 0$, equation (9) reduces to $$\left( \frac{q^3 N_D}{8\pi^2 \epsilon^3{}_s} \right)^{1/4} [(V_1 + V_D)^{1/4} - (V_D - V_2)^{1/4}] = \frac{1}{\beta} \ln \frac{e^{\beta V_2} - 1}{1 - e^{-\beta V_1}} \qquad (10)$$

Equations (3) and (9) can be solved numerically or graphically to give the electron current as a function of voltage. Since $J_{n1}$ is a slowly varying function of $V_1$, while $J_{n2}$ varies rapidly with $V_2$, most of the applied voltage will be across the contact 17.

2. Voltages Larger than the Reach-Through Voltage $V_{RT}$

The reach-through voltage $V_{RT}$ is defined as the voltage at which the sum of the depletion widths is exactly equal to L (see FIG. 4A). Since $$W_1=\sqrt{\frac{2\epsilon_s}{qN_D}(V_1+V_{D1})} \qquad (11)$$

$$W_2=\sqrt{\frac{2\epsilon_s}{qN_D}(V_{D2}-V_2)} \qquad (12)$$

the reach-through voltage can be obtained from the following expression $$W_1+W_2=L \qquad (13)$$

or $$V_{RT}=\frac{qN_D}{2\epsilon_s}L^2-(V_{D1}-V_{D2})-L\sqrt{\frac{2qN_D}{\epsilon_s}(V_{D2}-V_2)} \qquad (14)$$

$$=V_{FB}-\sqrt{4(V_{FB}+\Delta V_D)(V_{D2}-V_2)} \qquad (15)$$

where $$V_{FB}=\text{flat-band voltage}\equiv\frac{qN_D}{2\epsilon_s}L_2-(V_{D1}-V_{D2}) \qquad (16)$$

$$\Delta V_D = V_{D1}-V_{D2} \qquad (17)$$

The meaning of $V_{FB}$ will be clarified in the next section.

After reach-through, the electric field will be continuous and will vary linearly from $x=0$ to $x=L$. The magnitudes of the fields at $x=0$ and $x=L$ are $$E_{m1}=(V+V_{FB}+2\Delta V_D)/L \qquad (18)$$

$$E_{m2}=|V-V_{FB}|/L \qquad (19)$$

The field will pass through zero at a position $$x_0=\epsilon_s E_{m1}/qN_D. \qquad (20)$$

The voltages are given by $$V_1+V_{D1}=\frac{E_{m1}x_0}{2}=\frac{(V+V_{FB}+2\Delta V_D)^2}{4(V_{FB}+\Delta V_D)} \qquad (21)$$

$$V_{D2}-V_2=\frac{E_{m2}(L-x_0)}{2}=\frac{(V_{FB}-V)^2}{4(V_{FB}+\Delta V_D)} \qquad (22)$$

Since the depletion edge of the reverse-biased contact is pushed into that of the forward-biased one, the forward barrier is rapidly reduced with increasing voltage. It follows that the electron current is now limited by the reverse-biased contact and is given by equation (5) where the value for $E_{m1}$ is given by equation (18).

3. Voltages Larger than the Flat-Band Voltage $V_{FB}$

As the voltage increases further, eventually the electric field at $x=L$ becomes zero and the energy band at the contact 18 becomes flat (see FIG. 5B). The applied voltage corresponding to the above situation is called the flat-band voltage. Its magnitude can be obtained from equations (18) and (20) by setting $x_0=L$:

$$V_{FB}=\frac{qN_D}{2\epsilon_s}L^2-(V_{D1}-V_{D2}) \qquad (23)$$

This quantity has already been used in equations (15) to (19). For a symmetrical structure, i.e., $\Delta V_D = V_{D1}-V_{D2}=0$, equation (23) reduces to $$V_{FB}=(qN_D/2\epsilon_s)L^2. \qquad (24)$$

The maximum $V_{FB}$ is limited by the avalanche breakdown voltage.

For applied voltages larger than $V_{FB}$, we have effectively only one barrier contact. The maximum electric field is still given by equation (18). The electron current density is still given by equation (5), but in evaluating $\Delta\phi_{n1}$ and $\alpha_1 E_{m1}$, equation (18) should be used.

The maximum voltage that can be applied to an MSM structure is determined by the breakdown voltage. Because of the strong dependence of ionization rates on field, the maximum field $E_B$ at breakdown (for an abrupt junction with a given doping) is essentially a constant independent of the width of the depletion layer. From equation (18) we obtain for the breakdown voltage $V_B$ (with $E_{m1}=E_B$):

$$V = V_B=E_BL-V_{FB}-2\Delta V_D \qquad (25)$$

And for symmetrical structures $$V_B=E_BL-V_{FB}. \qquad (26)$$

II. HOLE CURRENT TRANSPORT

The hole current comes about because of the thermionic emission of holes from the contact 18. As shown in FIG. 11C, for small bias, the effective barrier for holes at contact 18 is given by $(\phi_{p2}+V_{D2}-V_2)$. Those emitted holes which diffuse from $x_2$ to $x_1$ constitute the hole current.

In the neutral region ($x_1>x>x_2$) the steady-state continuity equation for holes is given by $$\frac{\sigma^2_p}{\sigma x^2}-\frac{p-p_{n0}}{D_p\tau_p}=0 \qquad (27)$$

where $p_{n0}$ is the equilibrium hole density, $D_p$ is the diffusion coefficient, and $\tau_p$ the lifetime.

The solution of equation (27) is simply $$p-p_{n0}=Ae^{-x/L_p}+Be^{-x/L_p} \qquad (28)$$

where $L_p$ is the diffusion constant ($=\sqrt{D_p\tau_p}$). The boundary conditions are (1) at $x=x_1$ $p=p_{n0}\exp(-qV_1/kT)$, and (2) at $x=x_2$ $$J_{p2}=A_p{}^*T^2e^{-\beta(\phi_{p2}+V_{D2}-V_2)} \qquad (29)$$

where $A_p{}^*$ is the effective Richardson constant for holes. The arbitrary constants $A$ and $B$ in equation (28) can be determined from the boundary conditions. The hole current density $J_{p1}$ is then given by the gradient at $x_1$ and the condition that $J_{p1}=0$ at thermal equilibrium condition (i.e., $V=0$):

$$J_{p1}=qD_p\left.\frac{dp}{dx}\right|_{x_1}=\frac{qD_pp_{n0}\tanh\left(\frac{x_2-x_1}{L_p}\right)}{L_p}(1-e^{-\beta V_1})+\frac{A_p{}^*T^2e^{-\beta(\phi_{p1}+V_{D2})}}{\cosh\left(\frac{x_2-x_1}{L_p}\right)}(e^{\beta V_2}-1) \qquad (30)$$

For applied voltages in excess of $V_{RT}$, the neutral region, $(x_2-x_1)$, becomes zero; and the hole current reduces to $$J_{p1}=A_p{}^*T^2e^{-\beta(\phi_{p2}+V_{D2})}(e^{\beta V_2}-1) \qquad (31)$$

From Equations 22 and 31 we obtain for $V\geq V_{RT}$ $$J_{p1}=A_p{}^*T^2e^{-\beta\phi_{p2}}\left[e^{-\frac{\beta(V_{FB}-V)^2}{4(V_{FB}+\Delta V_D)}}-e^{-\beta V_{D2}}\right] \qquad (32)$$

At $V=V_{FB}$, the second term can be neglected and the hole current density is given by $$J_{p1}=A_p{}^*T^2e^{-\beta\phi_{p2}} \qquad (33)$$

For voltages in excess of $V_{FB}$, we have to consider the Schottky image-force lowering effect at contact 18, and the hole current is now expressed as $$J_{p1}=A_p{}^*T^2e^{-\beta\phi_{p2}}e^{\beta\Delta\phi_{p2}} \qquad (34)$$

where $$\Delta\phi_{p2}=\sqrt{\frac{qE_{m2}}{4\pi\epsilon_s}}=\sqrt{\frac{q(V-V_{FB})}{4\pi\epsilon_s L}} \qquad (35)$$

III. CURRENT-VOLTAGE CHARACTERISTICS

We can now add up the contributions of electron current and hole currents to give the total current. To facilitate presentation we shall define some important quantities:

$J_{ns}$ = electron saturation current density $$\equiv A_p{}^* T^2 e^{-q\phi_{n1}/kT}$$

$J_{ps}$ = hole saturation current density $$\equiv A_p{}^* T^2 e^{-q\phi_{p2}/kT}$$

$V_{FB}$ ≡ flat-band voltage $$= \frac{qN_D L^2}{2\epsilon_s} - (V_{d1} - V_{D2})$$

$V_{RT}$ = reach-through voltage $\cong V_{FB} - \sqrt{4V_{FB}V_{D2}}$

1. Small Voltage Range $V < V_{RT}$

From equations (5) and (30) we have $$J = J_{n1} + J_{p1} = J_{ns} e^{\beta\Delta\phi_{n1}}(1 - e^{-\beta V_1}) + \left[ \frac{qD_p p_n 0 \tanh\left(\frac{x_2 - x_1}{L_D}\right)}{L_D}(1 - e^{-\beta V_1}) + \frac{J_{ps} e^{-\beta V_{D2}}}{\cosh\left(\frac{x_2 - x_1}{L_D}\right)}(e^{\beta V_2} - 1) \right] \quad (36)$$

2. $V_{RT} < V < V_{FB}$ [Equations (5) and (32)]

$$J = J_{ns} e^{\beta\Delta\phi_{n1}} + J_{ps}\left[ e^{-\frac{\beta(V - V_{FB})^2}{4(V_{FB} + \Delta V_D)}} - e^{-\beta_{p2}} \right] \quad (37)$$

3. $V < V_{FB}$ [Equations (5) and (34)]

$$J = J_{ns} e^{\beta\Delta\phi_{n1}} + J_{ps} e^{\beta\Delta\phi_{p2}} \quad (38)$$

We shall now consider two important cases: (1) $J_{ns} << J_{ps}$ and (2) $J_{ns} >> J_{ps}$.

The first case implies that the electron barrier height $\phi_{n1}$ is much larger than the hole barrier height $\phi_{p2}$. For $V < V_{RT}$ the hole current is about one order of magnitude smaller than the electron current. However, for voltages larger than $V_{RT}$, the hole current increases rapidly according to equation (37), and reaches $J_{ps}$ (= $2\times10^3$ $A/cm^2$) at $V_{FB}$. For $V < V_{FB}$, the current increases slowly in accordance with equation (38), and finally reaches the breakdown condition given by equation (25).

For the second case, the hole current will be always smaller than the electron current; and the total current is essentially given by the first term of equation (36). As the voltage increases, we eventually obtain the same breakdown condition given by equation (25), at which the current starts to increase rapidly. A typical example, with identical parameters as in the first case except that $\phi_{p2} = 1$ $V$, is also shown in FIG. 7.

It is important to notice that the rapid increase of current near $V_{FB}$ (for the first case) is not due to avalanche breakdown but rather due to the hole emission from the contact 18. By proper selections of $N_D$ and $L$, we can obtain flat-band voltages from a few volts to thousands of volts. By varying the relative barrier heights $\phi_{n1}$ and $\phi_{p2}$ we can also obtain other I-V characters which fall between that of the above two cases.

IV. EXPERIMENTAL STUDY

1. Device Fabrication

The semiconductor material used for experimental structures was single-crystal silicon wafers with 11 Ω-cm resistivity, ($4\times10^{14}$ $cm^{-3}$ doping) < 111 > oriented, and with a dislocation density less than 100/$cm^2$. The wafers were Syton polished on both sides to a final thickness of 12 ± 1 $\mu$m.

The thinned wafers were given a degreasing cleaning cycle before being placed in a vacuum system. Platinum of 500 A. thickness was sputtered onto both sides of the wafer and was sintered to form approximately 1,000 A. PtSi on both sides. Chromium of 300 A. was deposited on one side, which was followed by a 3,000 A. layer of Au evaporation. The same depositions were then made on the other side. The wafer was mounted on a ceramic disc using Apeizon wax and a 3 $\mu$m layer of Au was placed onto the top side.

Standard photolithographic methods were used to define the circular patterns and the unprotected top gold layer was removed by iodide etch yielding circular arrays of gold dots on the silicon wafer with areas of $2\times10^{-3}$, $5\times10^{-4}$, and $1.25\times10^{-4}$ $cm^2$. The devices were separated by etching. After cleaning they were mounted in "V"-type packages.

The barrier heights, as determined from control samples with PtSi on one side and ohmic contact on the other, were 0.85 ± 0.05 $V$ for $\phi_{n1}$ (= $\phi_{n2}$) and 0.20 ± 0.05 $V$ for $\phi_{p2}$. These results are in good agreement with previous measurements.

2. C-V Measurement

The variation of the differential capacitance of an MSM structure can be considered in terms of two voltage ranges; viz., voltages smaller or greater than the reach-through voltage $V_{RT}$.

For $v < V_{RT}$ the resultant capacitance per unit area is due to two capacitances in series:

$$C = \frac{C_1 C_2}{C_1 + C_2} \quad (39)$$

where $$C_1 = \sqrt{Q\epsilon_s N_D / 2(V_1 + V_{D1})}$$
$$C_2 = \sqrt{q\epsilon_s N_D / 2(V_{D2} - V_2)} \quad (40)$$

For symmetrical structures and for $V << V_D$ ( $= V_{D1} = V_{D2}$), the resultant capacitance reduces to $$C = \sqrt{\frac{q\epsilon_s N_D}{2}}\left(\frac{1}{\sqrt{V_1 + V_D} + \sqrt{V_D - V_2}}\right) \approx \sqrt{\frac{q\epsilon_s N_D}{8V_D}}\left(1 + \frac{V^2}{32V_D{}^2}\right) \quad (41)$$

As the voltage increases, most of it will be across the contact 17 and the capacitance is then $$C \simeq \sqrt{\frac{q\epsilon_s N_D}{2}}\left(\frac{1}{\sqrt{V + V_D} + \sqrt{V_D}}\right) \quad (42)$$

For $V > V_{RT}$, the semiconductor is completely depleted, and the capacitance per unit area is the same as that for a parallel plate condenser:

$$C = \epsilon_s / L. \quad (43)$$

3. I-V Measurement

General current-voltage behavior was in agreement with predictions considered in Sec. III for the case $\phi_{n1} = 0.85$ $V$ and $\phi_{p2} = 0.2$ $V$. We found that around $V = 30$ $V$ the current increases rapidly. Also we found that in the high current region we have a negative temperature coefficient; i.e., as the temperature increases the voltage at which the current starts to increase rapidly, actually decreases. This is in contrast to avalanche breakdown which has a positive temperature coefficient.

We shall now study the high-current region in more detail. From equation (37), the dominant current component for $V_{RT} < V < V_{FB}$, is the hole current given by (for $\Delta V_D = 0$):

$$J \cong J_{p2} \exp\left[\frac{-\beta(V - V_{FB})^2}{4V_{FB}}\right] \quad (44)$$

A plot of $lnJ$ versus $(V - V_{FB})^2$ should yield a straight line with slope $q/4V_{FB}kT$, and the intercept at $V = V_{FB}$ should give the hole saturation current density $J_{ps}$. Experimental results were in fact in excellent agreement with equation (44). The flat-band voltage for 193°K and 300°K is determined from equation (24) to be 46 $V$ (i.e., $V_{FB} = qN_D L^2/2\epsilon_s$). The actual value of $V_{FB}$ was 41 $V$ at which value the current started to increase less rapidly. The difference of 41 $V$ and 46 volts indicates approximately a 10 percent deionization of impurities at 77°K.

For voltages larger than $V_{FB}$, the current should vary in accordance with equation (38) due to the Schottky lowering effect of $\phi_{p2}$, and experiment showed this to be true. Certain departures at lower currents were mainly due to surface leakage currents.

V. DISCUSSION

The current-voltage characteristics of MSM structures have been considered. The measured results of a symmetrical Si MSM structure are in good agreement with theoretical predictions.

The most important design parameters are the hole saturation current density $J_{ps}$, and the flat-band voltage given by $V_{FB} = qN_DL^2/2\epsilon_s$.

For oscillator applications we should choose (1) a large hole barrier at the contact 18 such that $J_{ps}$ is smaller than or comparable to $J_{ns}$, and (2) a $V_{FB}$ which is smaller than the avalanche breakdown voltage. Important features of an MSM structure used as an oscillator include:

1. No epitaxial process is necessary since a uniformly doped bulk semiconductor may used. This is often advantageous because high-quality bulk material is often easier to obtain, and additionally, any series resistance associated with the epitaxial substrate is eliminated.
2. With the elimination of the epitaxial process, the MSM structures can also be made on many other elemental and compound semiconductors by directly using their respective bulk materials.
3. There is no bulk series resistance since the structure is completely depleted at the reach-through voltage. With proper device design, it can be shown that one of the barriers can be eliminated before the other barrier reaches breakdown.
4. The MSM structure can be made with semiconductors (such as CdS) where pn junctions cannot be easily formed and with other semiconductors (such as diamond) where a conventional ohmic contact is difficult to form.
5. The elimination of the high-temperature diffusion steps, as used for pn junction structures can usually maintain the high quality of the starting materials.

What is claimed is:

1. An electronic circuit comprising:

a diode comprising a semiconductor wafer contained between first and second contacts;

the diode containing two rectifying junctions, one of which is a Schottky barrier junction formed by the first contact and the wafer;

said wafer being sufficiently thin that both the flat-band voltage and the reach-through voltage between the two rectifying junctions are smaller than the avalanche breakdown voltage;

means for forward-biasing the Schottky barrier junction at a value between the reach-through voltage and the flat-band voltage;

the minority carrier barrier of said forward-biased Schottky barrier junction being significantly smaller than one-half the band-gap energy of said wafer, thereby permitting diode conduction by copious minority carrier injection.

2. The electronic circuit of claim 1 wherein:

said forward-biasing means, said diode, and said circuit are appropriately arranged such that the voltage in the wafer never reaches the avalanche breakdown voltage.

3. The electronic circuit of claim 2 wherein:

the diode is included within a resonant circuit having a resonant frequency *f*;

the transit time of minority carriers between said rectifying junctions is on the order of three-fourths of a period of oscillation at said resonant frequency *f*;

and the biasing means includes a source of d-c energy, whereby the d-c energy is converted to oscillatory energy of said frequency *f*.

4. The electronic circuit of claim 2 wherein:

the diode is forward-biased by a d-c source at a d-c voltage below the flat-band voltage, and is additionally forward-biased by a signal component, whereby said minority carrier injection occurs when the sum of the d-c component and the signal component exceeds the reach-through voltage.

5. The electronic circuit of claim 4 wherein:

the diode shunts a signal propagating transmission line to a dissipative impedance, whereby the diode limits the signal voltage conducted by the transmission line.

6. The electronic circuit of claim 2 wherein:

the majority carrier concentration of the wafer is significantly higher in a limited region immediately adjacent the Schottky barrier junction than in the remainder of the wafer, thereby permitting a relatively higher electric field in the remainder of the wafer to improve carrier transit efficiency.

7. A diode comprising:

a semiconductor wafer contained between said first and second contacts;

the diode containing two rectifying junctions, one of which is a Schottky barrier junction formed by the first contact and the wafer;

said wafer being sufficiently thin that both the flat-band voltage and the reach-through voltage between the two rectifying junctions are smaller than the avalanche breakdown voltage;

said Schottky barrier junction being adapted to be forward-biased at a value between reach-through voltage and the flat-band voltage;

the minority carrier barrier of said Schottky barrier junction under said forward-bias condition being significantly smaller than one-half the band-gap energy of said wafer, thereby permitting diode conduction by copious minority carrier injection.

* * * * *